(12) United States Patent
Liu et al.

(10) Patent No.: US 10,656,488 B2
(45) Date of Patent: May 19, 2020

(54) ARRAY SUBSTRATE HAVING COMMON ELECTRODE THAT DOES NOT OVERLAP WITH GATE LINE, DISPLAY PANEL AND DISPLAY DEVICE

(71) Applicant: BOE Technology Group Co., Ltd., Beijing (CN)

(72) Inventors: Liwei Liu, Beijing (CN); Yoon-Sung Um, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 173 days.

(21) Appl. No.: 15/822,091

(22) Filed: Nov. 24, 2017

(65) Prior Publication Data
US 2018/0314123 A1 Nov. 1, 2018

(30) Foreign Application Priority Data

Apr. 28, 2017 (CN) .......................... 2017 1 0293911

(51) Int. Cl.
*G02F 1/1362* (2006.01)
*H01L 27/12* (2006.01)
(Continued)

(52) U.S. Cl.
CPC ...... *G02F 1/136286* (2013.01); *G02F 1/1368* (2013.01); *G02F 1/133512* (2013.01);
(Continued)

(58) Field of Classification Search
CPC ......... G02F 1/136286; G02F 1/133512; G02F 1/134336; G02F 1/1368; G02F 2201/121;
(Continued)

(56) References Cited

U.S. PATENT DOCUMENTS 8,258,556 B2 * 9/2012 Lee .................. G02F 1/1368
257/291
9,703,409 B2 * 7/2017 Ono .................. G02F 1/136227
(Continued)

FOREIGN PATENT DOCUMENTS

CN 101446725 6/2009
CN 101539701 9/2009
(Continued)

OTHER PUBLICATIONS

State Intellectual Property Office of People's Republich of China, "Notification of the First Office Action," issued in connection with Chinese Patent Application No. 201710293911.1, dated Apr. 25, 2019, 17 pages.

*Primary Examiner* — Huyen L Ngo
(74) *Attorney, Agent, or Firm* — Arent Fox LLP; Michael Fainberg

(57) ABSTRACT

The disclosure provides an array substrate, a display panel and a display device, and the array substrate includes: an insulation substrate, gate lines arranged on the insulation substrate to extend in a first direction, and data lines arranged on the insulation substrate to extend in a second direction, and to be insulated from the gate lines, the gate lines intersect with the data lines to define a plurality of pixel areas, each pixel area has a larger length in the first direction than that in the second direction, where the array substrate further includes a plurality of common electrodes, and a projection of each of the plurality of common electrodes on the insulation substrate and a projection of each of the gate lines on the insulation substrate do not overlap with each other.

19 Claims, 2 Drawing Sheets

(51) Int. Cl.
*G02F 1/1368* (2006.01)
*G02F 1/1343* (2006.01)
*G02F 1/1335* (2006.01)

(52) U.S. Cl.
CPC ...... *G02F 1/134336* (2013.01); *H01L 27/124* (2013.01); *G02F 1/136213* (2013.01); *G02F 2001/136218* (2013.01); *G02F 2201/121* (2013.01); *G02F 2201/123* (2013.01); *G02F 2201/40* (2013.01); *H01L 27/1255* (2013.01)

(58) Field of Classification Search
CPC ..... G02F 2001/136218; G02F 2201/40; G02F 2201/123; G02F 1/136213; G02F 1/136227; H01L 27/124; H01L 27/1255
See application file for complete search history.

(56) References Cited

U.S. PATENT DOCUMENTS

| | | | |
|---|---|---|---|
| 9,746,720 B2* | 8/2017 | Choi | G02F 1/134309 |
| 10,288,925 B2* | 5/2019 | Lee | G02F 1/13439 |
| 10,303,300 B2* | 5/2019 | Kimura | G02F 1/1368 |
| 10,324,345 B2* | 6/2019 | Chen | G02F 1/1368 |
| 2005/0140889 A1* | 6/2005 | Chae | G02F 1/133345 349/139 |
| 2007/0065991 A1* | 3/2007 | Kim | G02F 1/13439 438/149 |
| 2009/0015780 A1* | 1/2009 | Choi | G02F 1/13394 349/156 |
| 2009/0237342 A1 | 9/2009 | Maede et al. | |
| 2010/0079695 A1 | 4/2010 | Um et al. | |
| 2012/0176561 A1* | 7/2012 | Kim | G02F 1/134363 349/46 |

FOREIGN PATENT DOCUMENTS

| | | |
|---|---|---|
| CN | 202533686 | 11/2012 |
| CN | 104133334 | 11/2014 |

\* cited by examiner

ARRAY SUBSTRATE HAVING COMMON ELECTRODE THAT DOES NOT OVERLAP WITH GATE LINE, DISPLAY PANEL AND DISPLAY DEVICE

CROSS-REFERENCE TO RELATED APPLICATION

This Application claims priority to Chinese Patent Application No. 201710293911.1, filed on Apr. 28, 2017, the content of which is incorporated by reference in the entirety.

FIELD

The present disclosure relates to the field of liquid crystal displays, and particularly to an array substrate, a display panel and a display device.

DESCRIPTION OF THE RELATED ART

As well known, the quality of an image is the leading goal of a display device, and the degree of fine quality of the image is primarily determined by the resolution thereof. There are smaller pixels of the image with a higher resolution, and since corresponding shielding elements need to be arranged on the color filter substrate side to avoid uncontrollable emergent light from being leaked because the liquid crystal is disordered by a disordered electric field proximate to data lines or gate lines, there is undoubtedly also a lower aperture ratio, so the designers in the art have been devoted constantly to an improvement of the aperture ratio.

SUMMARY

In one aspect, an embodiment of the disclosure provides an array substrate including: an insulation substrate, gate lines arranged on the insulation substrate to extend in a first direction, and data lines arranged on the insulation substrate to extend in a second direction, and to be insulated from the gate lines, the gate lines intersect with the data lines to define a plurality of pixel areas, each pixel area has a larger length in the first direction than that in the second direction, wherein a gate insulation layer, a passivation layer, and a pixel electrode layer with a plurality of pixel electrodes are arranged sequentially above the gate lines, and a projection of the plurality of pixel electrodes on the insulation substrate covers a projection of the gate lines on the insulation substrate.

In another aspect, an embodiment of the disclosure further provides a display panel including: an array substrate, an opposite substrate arranged opposite thereto, and a liquid crystal layer arranged between them; wherein the array substrate includes an insulation substrate, gate lines arranged on the insulation substrate to extend in a first direction, and data lines arranged on the insulation substrate to extend in a second direction, and to be insulated from the gate lines, the gate lines intersect with the data lines to define a plurality of pixel areas, each pixel area has a larger length in the first direction than that in the second direction, wherein a gate insulation layer, a passivation layer, and a pixel electrode layer with a plurality of pixel electrodes are arranged sequentially above the gate lines, and a projection of the plurality of pixel electrodes on the insulation substrate covers a projection of the gate lines on the insulation substrate.

In still another aspect, an embodiment of the disclosure further provides a display device, including the display panel above.

BRIEF DESCRIPTION OF THE DRAWINGS

In order to make the technical solutions according to the embodiments of the present disclosure more apparent, the drawings to which a description of the embodiments refers will be briefly introduced below, and apparently the drawings to be described below are merely illustrative of some of the embodiments of the present disclosure, and those ordinarily skilled in the art can derive from these drawings other drawings without any inventive effort.

DETAILED DESCRIPTION OF THE EMBODIMENTS

Figure 1:
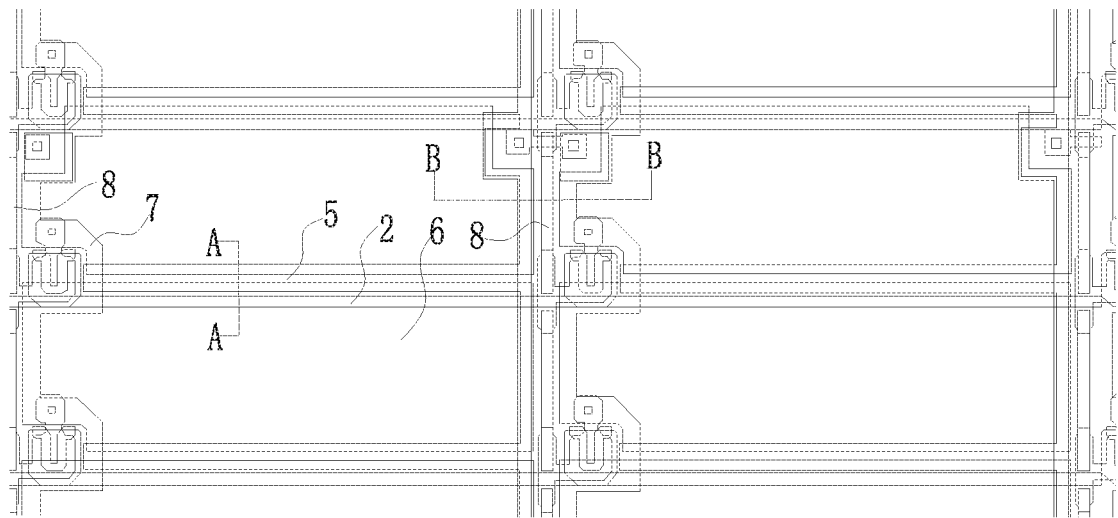
FIG. 1 is a schematic structural diagram of an array substrate according to an embodiment of the disclosure.

The embodiments of the disclosure will be described below in details, and examples of the embodiments are illustrated in the drawings throughout which identical or like reference numerals represent identical or like elements, or elements with identical or like functions. The embodiments to be described below with reference to the drawings are illustrative, and merely intended to set forth the disclosure, but shall not be construed as limiting the disclosure.

There is disclosed in Patent Application No. US20100079695A1 (with a publication date of Apr. 1, 2010) a liquid crystal display including a gate line, a gate insulation layer arranged above the gate line, a storage electrode passivation layer, and a pixel electrode, where the segmentation direction of a sub-pixel is changed from the traditional direction of a gate signal line to the direction of a data line, and a signal on the gate line is shielded by a storage electrode covering the gate line, thus reducing the number of the Black Matrix (BM) to be used, and improving the aperture ratio.

However since the thickness of an insulation medium between the gate line and the storage electrode is too small, a capacitor between the gate line and the storage electrode is so large that a period of time for charging a gate is approximately one third of that in the traditional design (in which the segmentation direction of the sub-pixel is the direction of the gate signal line), thus making it difficult to satisfy a required ratio of charging in the current process. Also since the storage electrode covers the gate signal line, there are two metal layers at a position of the gate, so that the gate signal line is placed so high at its corresponding position that tends to result in the problem of non-uniformity of the liquid crystal to be aligned.

An embodiment of the disclosure provides an array substrate so as to address the problem of a low aperture ratio in the array substrate manufactured in the traditional process, and also the problems in Patent Application No.

US20100079695A1 of a high load on a gate and of non-uniformity of the liquid crystal to be aligned, due to the gate which is positioned too high.

Figure 2:
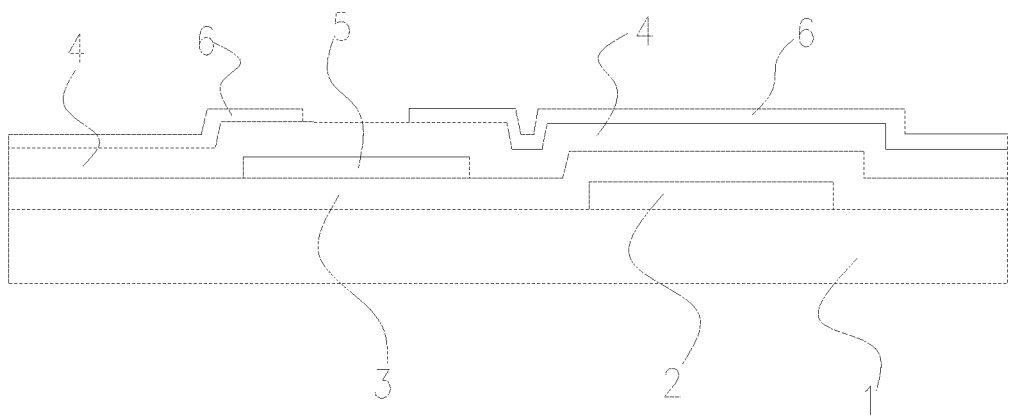
FIG. 2 is a sectional view taken along the line A-A of the array substrate illustrated in FIG. 1.
Figure 3:
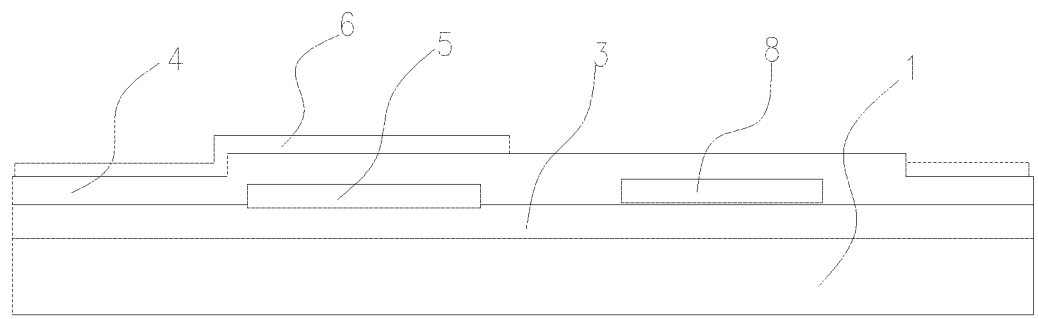
FIG. 3 is a sectional view taken along the line B-B of the array substrate illustrated in FIG. 1.

Referring to FIG. 1 to FIG. 3, FIG. 1 to FIG. 3 illustrates together a structure of an array substrate according to an embodiment of the disclosure.

In this embodiment, the array substrate includes an insulation substrate 1, gate lines 2, data lines 8, common electrodes 5, a gate insulation layer 3, a passivation layer 4, and a pixel electrode layer with a plurality of pixel electrodes 6.

Figure 4:
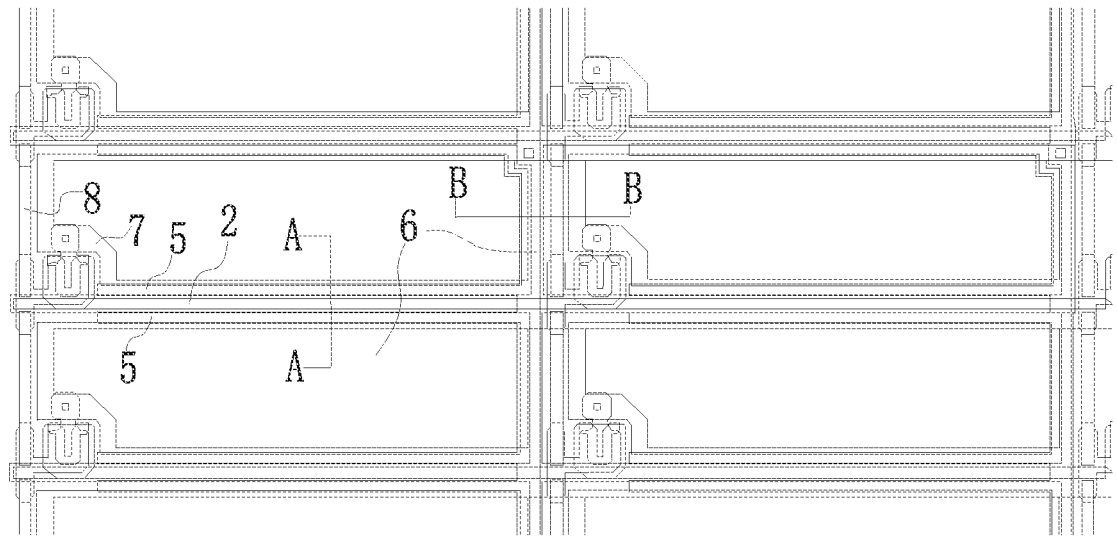
FIG. 4 is a schematic structural diagram of an array substrate according to another embodiment of the disclosure.

The gate lines 2 are arranged on the insulation substrate 1 to extend in a first direction (i.e. a direction of B-B as shown in FIG. 1 or FIG. 4), and the data lines 8 are arranged on the insulation substrate 1 to extend in a second direction (i.e. a direction of A-A as shown in FIG. 1 or FIG. 4), and to be insulated from the gate lines 2, wherein, the insulation substrate 1 can be a glass substrate. The gate lines 2 intersect with the data lines 8 to define a plurality of pixel area (not illustrated), each pixel area has a larger length in the first direction than that in the second direction.

The gate insulation layer 3, the passivation layer 4, and the pixel electrode layer with the plurality of pixel electrodes 6 are arranged sequentially above the gate lines 2, and a projection of the plurality of pixel electrodes 6 on the insulation substrate 1 covers a projection of the gate lines 2 on the insulation substrate 1. In some embodiments, a projection of a next row of pixel electrodes 6 on the insulation substrate 1 covers a projection of one of the gate lines 2 on the insulation substrate 1, that is, a projection of the (N+1)-th row of pixel electrodes 6 on the insulation substrate 1 covers a projection of the N-th row of gate line 2 on the insulation substrate 1 to thereby shield a gate signal.

In the array substrate according to the embodiment of the disclosure, the segmentation direction of the sub-pixel is changed from the traditional direction of the gate signal lines to the direction of the data lines, and the projection of the plurality of pixel electrodes on the insulation substrate covers the projection of the gate lines on the insulation substrate to thereby shield gate signals so as to avoid uncontrollable emergent light from being leaked because the liquid crystal is disordered by a disordered electric field proximate to the gate lines 2, so that the Black Matrix 7 (BM), which is a shielding element, on the color filter substrate side can be dispensed to thereby improve the aperture ratio.

In the embodiment of the disclosure, the main load on the gates includes the gate lines 2, the plurality of pixel electrodes 6, and an insulation medium between them, and since the insulation medium between the gate lines 2 and the plurality of pixel electrodes 6 are arranged in two layers (i.e., the gate insulation layer 3 and the passivation layer 4), the spacing between the gate lines 2 and the plurality of pixel electrodes 6 is increased, thus lowering the main load on the gates, and improving the charging efficiency.

In some embodiments, the thickness of the gate insulation layer 3 ranges from 300 nm to 400 nm approximately, and the thickness of the passivation layer 4 ranges from 150 nm to 250 nm approximately.

In the embodiment of the disclosure, the plurality of pixel electrodes 6 shield signals radiated by the gate lines 2 to the outside, thus lowering a load capacitance on a gate signal line by approximately 40% as compared with the solution in Patent Application No. US20100079695A1.

While a frame of image is being displayed, a gate signal line is enabled for a very short period of time in which a gate is charged, and liquid crystal molecules need to be maintained unaltered in the remaining period of time, so a capacitor needs to be arranged for them to provide voltage required for maintaining their orientation, i.e., a storage capacitor.

In some embodiments, the storage capacitor is generally formed between the plurality of pixel electrodes 6 and the common electrodes 5. In some embodiments, the passivation layer 4 on one side of each gate line 2 in the width direction (i.e. the direction of A-A as shown in FIG. 1 or FIG. 4) humps up, and defines together with the underlying gate insulation layer 3 an accommodation space (not illustrated), and a common electrode 5 is arranged in the accommodation space; and a projection of each common electrode 5 on the insulation substrate 1 at least partially overlaps with the projection of the plurality of pixel electrodes 6 on the insulation substrate 1, to thereby form a desirable storage capacitor.

In some embodiments, each common electrode 5 has a first part extending in the first direction, and as illustrated in FIG. 1 and FIG. 2, the first part of each common electrode 5 is arranged paralleled to a gate line 2, and the edges of both sides of a projection of the first part of each common electrode 5 on the insulation substrate 1 in the width direction overlaps with the projection of the plurality of pixel electrodes 6 on the insulation substrate 1. In addition, each common electrode 5 further has a second part extending in the second direction, and as illustrated in FIG. 1 and FIG. 3, the second part of each common electrode 5 is arranged paralleled to a data line 8.

In some embodiments, each common electrode 5 can be arranged beside a gate line 2 to thereby avoid the gate line 2 from being positioned too high due to the two metal layers arranged at the position of the gate line 2, which would otherwise result in the problem of non-uniformity of the liquid crystal to be aligned. In some embodiments, each common electrode 5 is arranged proximate to a gate line 2 to thereby shield a signal radiated by the gate line 2 to the outside so as to further narrow a BM range, thus improving the aperture ratio.

Figure 5:
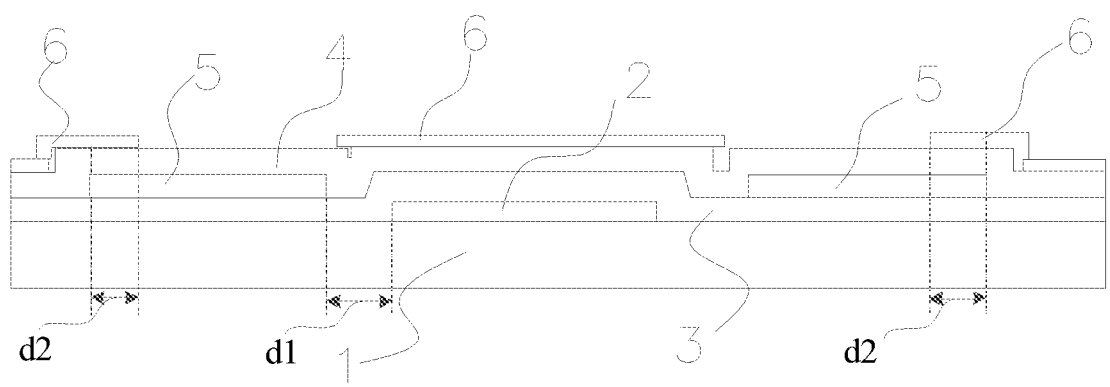
FIG. 5 is a sectional view taken along the line A-A of the array substrate illustrated in FIG. 4.

In some embodiments, in view of a fluctuating process capacity, and in order to enable the projection of each common electrode 5 on the insulation substrate 1 and the projection of the gate lines 2 on the insulation substrate 1 not to overlap with each other, the spacing in the first direction between each common electrode 5 and a corresponding gate line 2 (i.e. a distance d1 (as shown in FIG. 5) between the projection of each common electrode 5 on the insulation substrate 1 and a projection of a gate line 2 proximate to the each common electrode 5) is at least 1.5 μm. However a common electrode is made of metal through which no light is transmitted; it is inadvisable to place it too far away from a gate electrode, so the spacing in the first direction between each common electrode 5 and a corresponding gate line 2 is approximately 2 μm to thereby avoid the aperture ratio from being significantly degraded due to a too large spacing between them.

Since a common electrode 5 made of metal is arranged in a pixel area, the aperture ratio is somewhat degraded, so in the embodiment of the disclosure, given the desirable storage capacitor, the overlapping area between the projection of each common electrode 5 on the insulation substrate 1 and the projection of the plurality of pixel electrodes 6 on the insulation substrate 1 is reduced to thereby reduce the width of a shielding layer so as to improve the aperture ratio. In some embodiments, the overlapping width d2 (as shown in FIG. 5) between the projection of each common electrode 5 on the insulation substrate 1 and the projection of the plurality of pixel electrodes 6 on the insulation substrate 1 ranges from 1.5 µm to 2 µm approximately for a larger aperture ratio.

In the embodiment of the disclosure, in order to ensure the desirable storage capacitor while there is a small overlapping area between the projection of each common electrode 5 on the insulation substrate 1 and the projection of the plurality of pixel electrodes 6 on the insulation substrate 1, the thickness of the passivation layer 4 between the common electrodes 5 and the plurality of pixel electrodes 6 is reduced accordingly; and in some embodiments, the thickness of the passivation layer 4 between the common electrodes 5 and the plurality of pixel electrodes 6 ranges from 150 nm to 250 nm approximately.

Referring to FIG. 3, in some embodiments, the plurality of common electrodes 5 are arranged at the same layer as the data lines 8, and the plurality of common electrodes 5 and the data lines 8 are made of metal at the same layer, and do not overlap with each other to thereby avoid a capacitor from being formed between them so as to lower a load on the data lines, thus lowering an energy loss.

As can be apparent from the description above, there is an insulation medium between the gate lines 2 and the plurality of pixel electrodes 6; and in a period of time of one frame, a gate signal is temporally variable in a very short period of time, but fixed in the remaining period of time. A storage capacitor can also be formed between the gate lines 2 and the plurality of pixel electrodes 6 to maintain orientation of the liquid crystal, where the gate lines 2 act as potential reference electrodes.

Referring to FIG. 4 and FIG. 5, FIG. 4 and FIG. 5 illustrate structural diagrams of an array substrate according to another embodiment of the disclosure.

Like the array substrate according to the embodiment above, the array substrate according to this embodiment includes an insulation substrate 1, gate lines 2, data lines 8, a gate insulation layer 3, a passivation layer 4, a plurality of pixel electrodes 6, and common electrodes 5, where a relative relationship between the insulation substrate 1, the gate lines 2, the data lines 8, the gate insulation layer 3, the passivation layer 4, and the plurality of pixel electrodes 6 is substantially the same as that in the embodiment above except that the common electrodes 5 are arranged on both sides of each gate line 2 in the width direction, and an edge of one side of the projection of the first part of each common electrode 5 on the insulation substrate 1 in the width direction overlaps with the projection of the plurality of pixel electrodes 6 on the insulation substrate 1 to form the storage capacitor.

In some embodiments, the positions of two common electrodes 5 on both sides of each gate line 2 in the width direction overlap with a position of the BM to thereby avoid a shielded area from being increased due to an additional common electrode; and since only one electrode connection hole is required, the aperture ratio is improved over the related art. In addition, one side of the projection of the first part of each common electrode 5 on the insulation substrate 1 in the width direction overlaps with the projection of the plurality of pixel electrodes 6 on the insulation substrate 1, and the other side thereof do not overlap with the projection of the plurality of pixel electrodes 6 on the insulation substrate 1, thus avoiding the aperture ratio from being lowered due to an increased shielded area.

In an application, an embodiment of the disclosure provides a display panel including the array substrate above, and also an opposite substrate and a liquid crystal layer, where the opposite substrate includes a color filter, a BM, etc., and the liquid crystal is filled in the liquid crystal layer; and the opposite substrate is arranged opposite to the array substrate, and the liquid crystal layer is arranged between them. Since the plurality of pixel electrodes 6 shield gate signals, and the BM on the color filter substrate side is dispensed, the aperture ratio can be significantly improved, and the aperture ratio can be alleviated from being lost while aligning the opposite substrate and the array substrate to arrange the liquid crystal layer. Since the aperture ratio of each pixel is improved, if there is a higher resolution of the display panel including the array substrate according to the embodiment of the disclosure, then there will be a better improvement effect of the aperture ratio, and the quality of an image displayed on the display panel will also be finer.

In an application, an embodiment of the disclosure further provides a display device including the display panel above, and since there is a higher aperture ratio of the array substrate in the display panel of the display device, the quality of an image thereof is finer.

The foregoing disclosure is merely illustrative of a part of the embodiments of the disclosure, and it shall be noted that those ordinarily skilled in the art can further make several adaptations and variations thereto without departing from the principle of the disclosure, and these adaptations and variations shall also fall into the scope of the disclosure as claimed.

The invention claimed is:

1. An array substrate, comprising:
an insulation substrate, gate lines arranged on the insulation substrate to extend in a first direction, and data lines arranged on the insulation substrate to extend in a second direction, and to be insulated from the gate lines, the gate lines intersect with the data lines to define a plurality of pixel areas, each pixel area has a larger length in the first direction than that in the second direction, wherein a gate insulation layer, a passivation layer, and a pixel electrode layer with a plurality of pixel electrodes are arranged sequentially above the gate lines, and a projection of each of the plurality of pixel electrodes on the insulation substrate covers a projection of each of the gate lines on the insulation substrate;
wherein the array substrate further comprises a plurality of common electrodes, and a projection of each of the plurality of common electrodes on the insulation substrate and the projection of each of the gate lines on the insulation substrate do not overlap with each other.

2. The array substrate according to claim 1, wherein an accommodation space is defined between the gate insulation layer and the passivation layer on at least one side of each of the gate lines in a width direction, and each of the plurality of common electrodes is arranged in the accommodation space; and the projection of each of the plurality of common electrodes on the insulation substrate partially overlaps with the projection of each of the plurality of pixel electrodes on the insulation substrate.

3. The array substrate according to claim 2, wherein each of the plurality of common electrodes is arranged proximate to a corresponding gate line of the gate lines.

4. The array substrate according to claim 3, wherein a distance between the projection of each of the plurality of common electrodes on the insulation substrate and a projection of the corresponding gate line proximate to the each of the plurality of common electrodes ranges from 1.5 µm to 2 µm approximately.

5. The array substrate according to claim 2, wherein an overlapping width between the projection of each of the plurality of common electrodes on the insulation substrate and the projection of each of the plurality of pixel electrodes on the insulation substrate ranges from 1.5 µm to 2.5 µm approximately.

6. The array substrate according to claim 5, wherein a thickness of the passivation layer between the plurality of common electrodes and the plurality of pixel electrodes ranges from 150 nm to 250 nm approximately.

7. The array substrate according to claim 2, wherein each of the plurality of common electrodes has a first part extending in the first direction, and an edge of only one side of a projection of the first part of each of the plurality of common electrodes on the insulation substrate in the width direction overlaps with the projection of each of the plurality of pixel electrodes on the insulation substrate.

8. The array substrate according to claim 2, wherein the plurality of common electrodes and the data lines are arranged at a same layer, and the plurality of common electrodes and the data lines do not overlap with each other.

9. The array substrate according to claim 1, wherein a thickness of the gate insulation layer between the gate lines and the passivation layer ranges from 300 nm to 400 nm approximately, and a thickness of the passivation layer between the gate insulation layer and the plurality of pixel electrodes ranges from 150 nm to 250 nm approximately.

10. A display panel, comprising:
an array substrate, an opposite substrate arranged opposite thereto, and a liquid crystal layer arranged between the array substrate and the opposite substrate, wherein the array substrate comprises an insulation substrate, gate lines arranged on the insulation substrate to extend in a first direction, and data lines arranged on the insulation substrate to extend in a second direction, and to be insulated from the gate lines, the gate lines intersect with the data lines to define a plurality of pixel areas, each pixel area has a larger length in the first direction than that in the second direction, wherein a gate insulation layer, a passivation layer, and a pixel electrode layer with a plurality of pixel electrodes are arranged sequentially above the gate lines, and a projection of each of the plurality of pixel electrodes on the insulation substrate covers a projection of each of the gate lines on the insulation substrate;
wherein the array substrate further comprises a plurality of common electrodes, and a projection of each of the plurality of common electrodes on the insulation substrate and the projection of each of the gate lines on the insulation substrate do not overlap with each other.

11. The display panel according to claim 10, wherein an accommodation space is defined between the gate insulation layer and the passivation layer on at least one side of each of the gate lines in a width direction, and each of the plurality of common electrodes is arranged in the accommodation space; and the projection of each of the plurality of common electrodes on the insulation substrate partially overlaps with the projection of each of the plurality of pixel electrodes on the insulation substrate.

12. The display panel according to claim 11, wherein each of the plurality of common electrodes is arranged proximate to a corresponding gate line of the gate lines.

13. The display panel according to claim 12, wherein a distance between the projection of each of the plurality of common electrodes on the insulation substrate and a projection of the corresponding gate line proximate to the each of the plurality of common electrodes ranges from 1.5 µm to 2 µm approximately.

14. The display panel according to claim 11, wherein an overlapping width between the projection of each of the plurality of common electrodes on the insulation substrate and the projection of each of the plurality of pixel electrodes on the insulation substrate ranges from 1.5 µm to 2.5 µm approximately.

15. The display panel according to claim 14, wherein a thickness of the passivation layer between the plurality of common electrodes and the plurality of pixel electrodes ranges from 150 nm to 250 nm approximately.

16. The display panel according to claim 11, wherein each of the plurality of common electrodes has a first part extending in the first direction, and an edge of only one side of a projection of the first part of each of the plurality of common electrodes on the insulation substrate in a width direction overlaps with the projection of each of the plurality of pixel electrodes on the insulation substrate.

17. The display panel according to claim 11, wherein the plurality of common electrodes and the data lines are arranged at a same layer and the plurality of common electrodes and the data lines do not overlap with each other.

18. The display panel according to claim 10, wherein a thickness of the gate insulation layer between the gate lines and the passivation layer ranges from 300 nm to 400 nm approximately, and a thickness of the passivation layer between the gate insulation layer and the plurality of pixel electrodes ranges from 150 nm to 250 nm approximately.

19. A display device, comprising the display panel according to claim 10.

* * * * *